(12) United States Patent
Yetter et al.

(10) Patent No.: US 7,581,296 B2
(45) Date of Patent: Sep. 1, 2009

(54) ACOUSTIC STACK FOR ULTRASONIC TRANSDUCERS AND METHOD FOR MANUFACTURING SAME

(75) Inventors: Kelley E. Yetter, Lewistown, PA (US); James Norman Barshinger, Scotia, NY (US); Brian Van Corcelius, Burnham, PA (US)

(73) Assignee: GE Inspection Technologies, LP, Lewistown, PA (US)

( * ) Notice: Subject to any disclaimer, the term of this patent is extended or adjusted under 35 U.S.C. 154(b) by 0 days.

(21) Appl. No.: 11/849,411

(22) Filed: Sep. 4, 2007

(65) Prior Publication Data

US 2008/0252172 A1    Oct. 16, 2008

Related U.S. Application Data (60) Provisional application No. 60/911,108, filed on Apr. 11, 2007.

(51) Int. Cl.
*H04R 17/00* (2006.01)
(52) U.S. Cl. .................................... 29/25.35
(58) Field of Classification Search ............... 29/25.35, 29/831, 412, 417, 593; 600/459; 310/311, 310/328, 334, 336; *H04R 17/00*
See application file for complete search history.

(56) References Cited

U.S. PATENT DOCUMENTS

| 5,327,895 | A  |   | 7/1994  | Hashimoto |
| 6,467,140 | B2 | * | 10/2002 | Gururaja .................... 29/25.35 |
| 6,538,363 | B2 | * | 3/2003  | Nagahara et al. ........... 29/25.35 |
| 6,789,427 | B2 |   | 9/2004  | Batzinger et al. |
| 6,822,376 | B2 |   | 11/2004 | Baumgartner |
| 7,017,245 | B2 |   | 3/2006  | Baumgartner et al. |
| 7,082,655 | B2 | * | 8/2006  | Yetter et al. ................ 29/25.35 |
| 7,148,608 | B2 |   | 12/2006 | Baumgartner et al. |
| 7,156,938 | B2 |   | 1/2007  | Baumgartner et al. |

FOREIGN PATENT DOCUMENTS

WO    WO 2006/083245 A    8/2006

\* cited by examiner

*Primary Examiner*—Quyen Leung
*Assistant Examiner*—Karen B Addison
(74) *Attorney, Agent, or Firm*—GE Global Patent Operation (57) ABSTRACT

An acoustic stack for ultrasonic transducers comprising a backing block, flexible printed circuit board, piezoelectric ceramic layer, and acoustic matching layer. The various components of the acoustic stack are bonded together using an adhesive material and high pressure in a lamination process. The piezoelectric ceramic layer is manufactured to provide electrical and acoustic isolation without the need for dicing through multiple layers of the acoustic stack. A flex circuit provides the necessary electrical connections to the electrically isolated electrodes of the piezoelectric ceramic layer.

10 Claims, 8 Drawing Sheets

ACOUSTIC STACK FOR ULTRASONIC TRANSDUCERS AND METHOD FOR MANUFACTURING SAME

CROSS REFERENCE TO RELATED APPLICATIONS

This application claims priority from, and incorporates by reference the entirety of, U.S. Provisional Patent Application Ser. No. 60/911,108 filed Apr. 11, 2007.

BACKGROUND OF THE INVENTION

This invention generally relates to acoustic stacks for ultrasonic transducers and methods for manufacturing those stacks.

Ultrasonic transducers incorporate piezoelectric ceramics which are electrically connected to a pulsing-receiving unit in the form of an ultrasonic test unit. Portions of the surfaces of the piezoelectric ceramics are metal coated (with a sputter plating process), forming electrodes (signal and ground), which are connected to the ultrasonic test unit. During operation, an electrical waveform pulse is applied to the electrodes of the piezoelectric ceramic, causing a mechanical change in ceramic dimension and generating an acoustic wave, which is transmitted through a material such as a metal to which the ultrasonic transducer is coupled. Conversely, when an acoustic wave reflected from the material under inspection contacts the surface of the piezoelectric ceramic, it generates a voltage difference across the electrodes that is detected as a receive signal by the ultrasonic test unit or other signal processing electronics.

The amplitude, timing and transmit sequence of the electrical waveform pulses applied by the pulsing unit are determined by various control means incorporated in the ultrasonic test unit. The pulse is generally in the frequency range of about 0.5 MHz to about 25 MHz, so it is referred to as an ultrasonic wave from which the equipment derives its name. By tracking the time difference between the transmission of the electrical pulse and the receipt of the electrical signal and measuring the amplitude of the received wave, various characteristics of the material can be determined. Thus, for example, ultrasonic testing can be used to determine material thickness or the presence and size of imperfections within a material.

Many ultrasonic transducers are phased arrays comprising single or multiple rows of electrically and acoustically independent or isolated transducer elements. A linear array of independent transducer elements can form what is referred to as a transducer pallet comprising a plurality of independent transducer elements. In these types of transducers, each transducer element may be a layered structure comprising a backing block, flexible printed circuit board ("flex circuit"), piezoelectric ceramic layer, and acoustic matching layer. This layered structure is often referred to as an acoustic stack. The various components of the acoustic stack can be bonded together using an adhesive material (e.g., epoxy) and high pressure in a lamination process.

Typically, one or more flex circuits are used to make electrical connections (signal and ground) from the piezoelectric ceramic to the ultrasonic test unit, or to a bundle of coaxial cables that ultimately connect to the ultrasonic test unit or other signal processing electronics. Prior to bonding with the flex circuit, the piezoelectric ceramic can be processed to produce a plurality of spaced columns/posts or planes projecting from a solid piece of the ceramic material which is unaffected by the processing. This unaffected solid piece of ceramic is referred to as the ceramic backbone. After the plurality of spaced columns or spaced planes, also referred to as a diced ceramic, has been formed, the spacing between the columns or planes is filled with an epoxy. Sufficient epoxy is applied to form a continuous layer of epoxy, or epoxy backbone, overlying the diced ceramic and opposite the ceramic backbone.

The ceramic backbone and epoxy backbone are removed by grinding below the backbones into the diced ceramic, removing a small portion of each post or plane, resulting in a plurality of ceramic posts embedded in epoxy. Both sides of the ceramic workpiece are then finish ground, resulting in the ceramic posts being depressed typically from about 15,000 to about 30,000 Angstroms below the epoxy. The ceramic workpiece is then cleaned and sputter plated, providing a very thin plating over the surface having a thickness is about 15,000 Angstroms. Because the ceramic posts are depressed below the surface of the epoxy, it is possible that the sputtering process may not provide a uniform coating of the surface, particularly along the perpendicular surfaces extending between the parallel planes of epoxy and ceramic material. In addition, since the sputter plating operation is performed at temperatures of about 120° C. (about 250° F.), the epoxy is free to expand unrestrained above the ceramic posts or planes. Even though this expansion is small, because of the thinness of the plating deposited by the sputter plating process, it can be sufficient to damage the thin plating extending in the vertical direction along the epoxy between the ceramic posts and the horizontal surface of the epoxy, causing poor performance of the ceramic, such as low capacitance. It is therefore desirable to provide a piezoelectric ceramic layer wherein the ceramic posts are above rather than depressed below the epoxy.

One method of forming a linear array of independent transducer elements is to laminate a single acoustic stack of a certain length that is then diced into separate transducer elements, each element laminated together to form an independent acoustic stack. A dicing saw is used to form parallel element isolation cuts or kerfs, with each cut passing completely through the acoustic matching layer, the piezoelectric ceramic layer, the flex circuit, and extending only partially into the backing block. These kerfs provide electrical and acoustic isolation between the independent transducer elements. The need for dicing the acoustic stack complicates and lengthens the manufacturing process. It is therefore desirable to provide electrical and acoustic isolation between transducer elements without the requirement of dicing the acoustic stack.

BRIEF DESCRIPTION OF THE INVENTION

In one embodiment of the present invention, a method for preparing a piezoelectric ceramic workpiece for use in an ultrasonic transducer, comprising the steps of providing a piezoelectric ceramic layer, wherein said piezoelectric ceramic layer comprises a plurality of ceramic posts isolated from each other by non-conductive material and wherein said plurality of ceramic posts extend above said non-conductive material; plating said piezoelectric ceramic layer with conductive material; forming a first electrode and a second electrode on said piezoelectric ceramic layer from said conductive material on said plurality of ceramic posts; poling said first electrode and said second electrode on said piezoelectric ceramic layer, wherein said poling activates said plurality of ceramic posts; and dicing said piezoelectric ceramic layer, wherein said dicing forms a plurality of isolation cuts removing said conductive material and thereby forming a plurality of signal electrodes from said first electrode and a plurality of ground electrodes from said second electrode.

In another embodiment, further steps include providing a flexible printed circuit board, wherein said flexible circuit board comprises a first plurality of conductive elements configured to physically align with said plurality of signal electrodes and a second plurality of conductive elements configured to physically align with said plurality of ground electrodes; providing adhesive non-conductive material between said piezoelectric ceramic layer and said flexible printed circuit board, wherein said adhesive non-conductive material covers said plurality of ceramic posts; and bonding said piezoelectric ceramic layer to said flexible printed circuit board thereby forming electrical connections between said first plurality of conductive elements and said plurality of signal electrodes on said plurality of ceramic posts and electrical connections between said second plurality of conductive elements and said plurality of ground electrodes on said plurality of ceramic posts, wherein said plurality of ceramic posts remove said adhesive non-conductive material during said bonding to form said electrical connections.

DETAILED DESCRIPTION OF THE INVENTION

Figure 1:
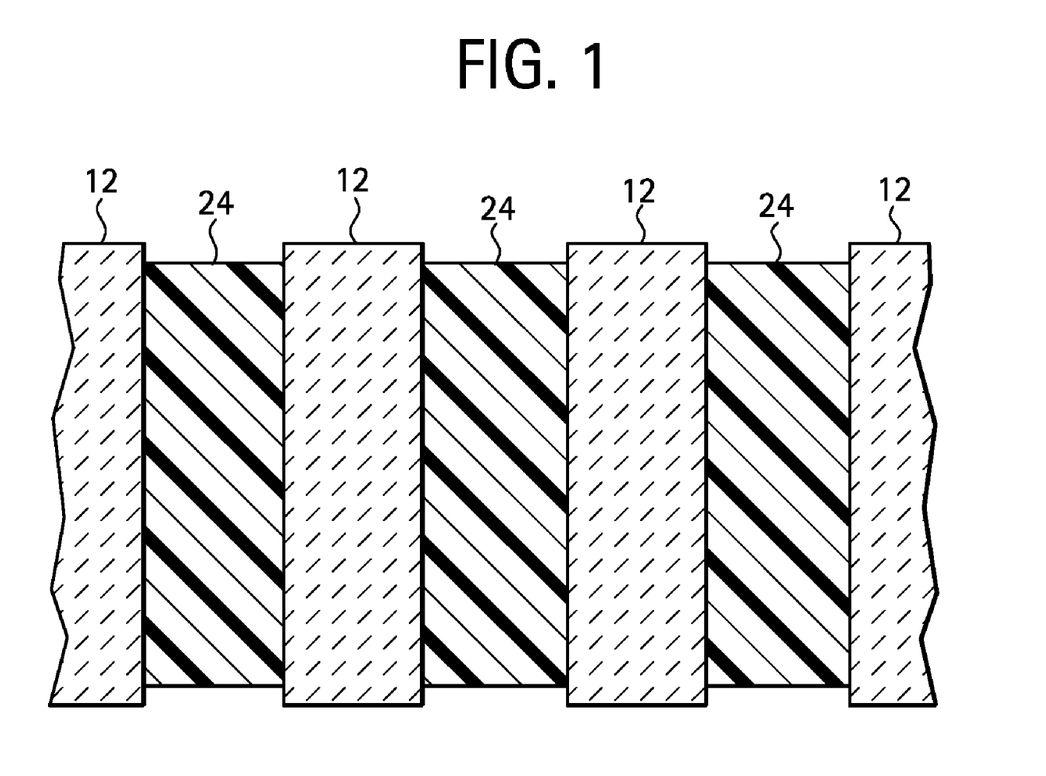
FIG. 1 is a cross-sectional view of the piezoelectric ceramic layer of after plasma etching, depicting the ceramic posts lying above the surface of the epoxy.

FIG. 1 depicts a cross-sectional view of a piezoelectric ceramic layer 10 used in an acoustic stack 100 of an ultrasonic transducer. Included in the cross-section is a plurality of ceramic posts 12, each spaced from an adjacent ceramic post 12 by a non-conductive material 24, such as a polymer. In one embodiment, the ceramic posts 12 are made of a composite ceramic and the polymer is an epoxy. It will be understood by those skilled in the art that other ceramic materials and other non-conductive polymers can be used without departing from the scope of the invention The ceramic posts 12 are characterized by their ability to vibrate when exposed to an electrical excitation, thereby generating an acoustic wave, and to generate an electrical pulse when excited by an incident acoustic wave. A preferred piezoelectric ceramic material is lead-zirconate-titanate (PZT), although other equivalent materials such as polycrystalline relaxor materials (PZN-PT materials) and biased electrorestrictor materials (PMN-PT ferroelastic relaxor materials) may be used as is known in the art.

Figure 2:
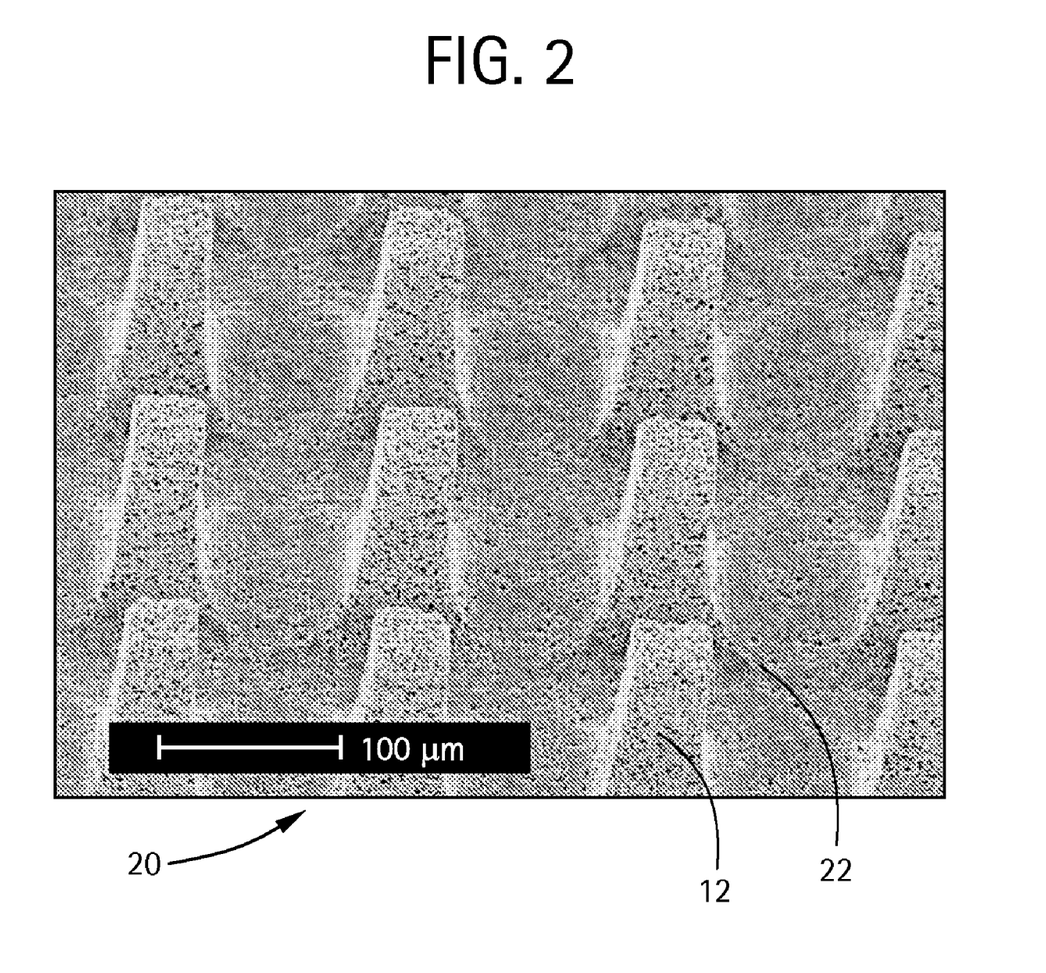
FIG. 2 is a perspective view of ceramic posts after dicing.

The ceramic posts 12 are initially provided as a block of ceramic material of preselected size. The preselected size is chosen on the basis of the size of the ultrasonic transducer. The ceramic block is typically mechanically cut into a plurality of posts 12, yielding a two dimensional array of posts 12. The methods of performing such cuts are well-known and any acceptable method for cutting the block may be used. It is preferred that the ceramic block be cut using a dicing saw to create the checkered post pattern. The diced ceramic block 20 having the ceramic posts 12 projecting upward form a ceramic backbone 22 is shown in FIG. 2, the spacing between the ceramic posts 12 being the kerfs remaining after the block has been diced.

Figure 3:
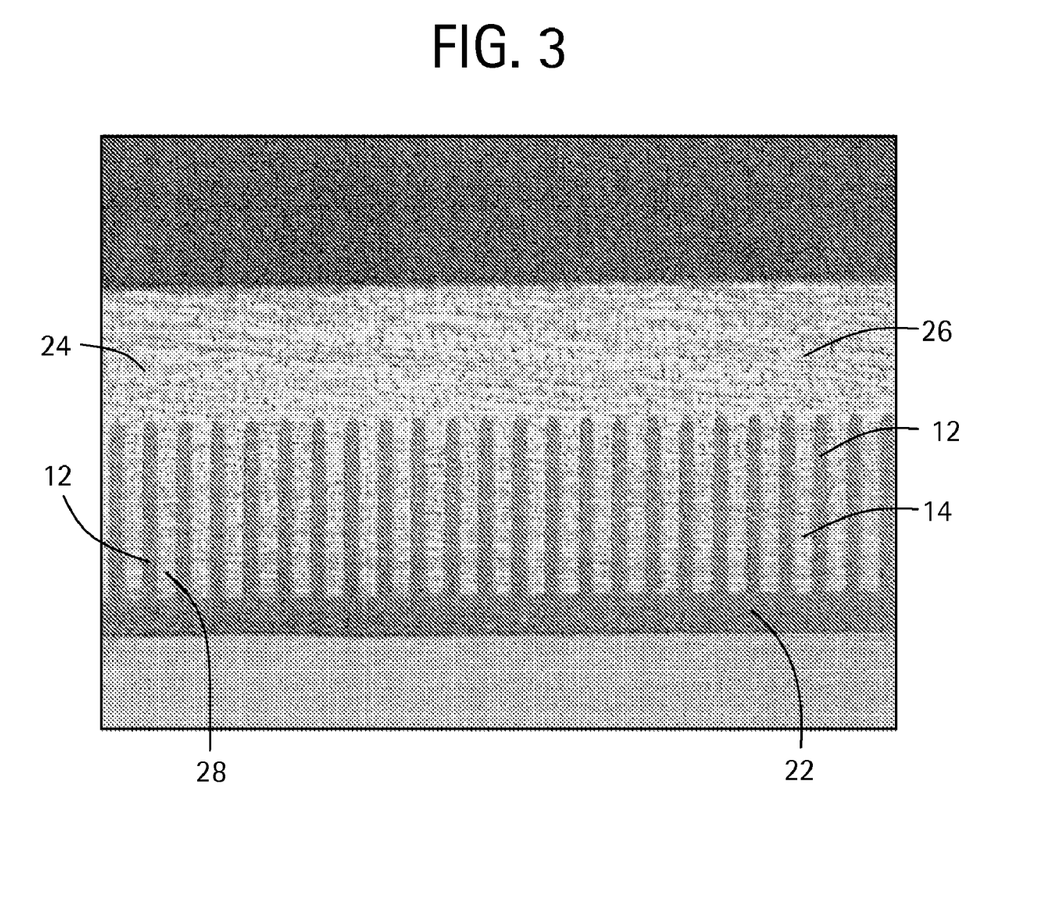
FIG. 3 is a cross-sectional view of a ceramic block filled with epoxy.

The kerfs of the diced ceramic block 20 are then filled with a nonconductive material 24, as depicted in FIG. 3, which is a cross-sectional view of a block 20 filled with an epoxy 24 to provide structural support, particularly in the transverse direction under a shear load, for the thin and brittle ceramic posts 12. As can be seen in FIG. 3, the epoxy 24 forms an epoxy backbone 26 that overlies the ceramic posts 12, and fills the interstitial areas 28 between the posts 12.

Figure 4:
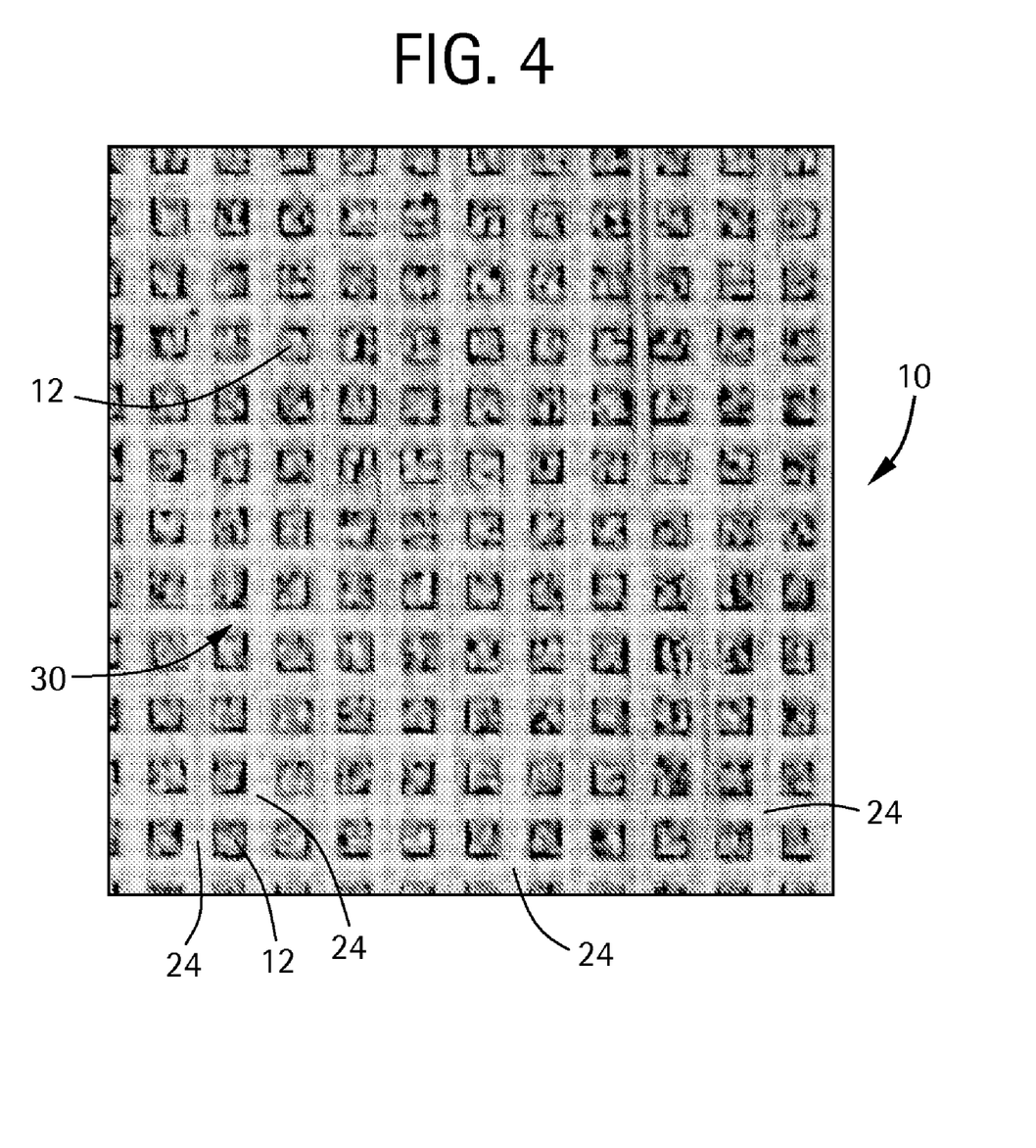
FIG. 4 is a top view of the ceramic workpiece after finish grinding operations have been completed.

Both the ceramic backbone 22 and the epoxy backbone 26 must be removed. The ceramic backbone 22 and the epoxy backbone 26 typically initially are rough ground to remove the bulk of the material. It is desirable to rough grind both the ceramic backbone 22 and the epoxy backbone 26 as close as possible to the ceramic posts without exposing the ceramic posts. However, sometimes the grinding may extend slightly below the backbones 22, 26. The next mechanical operation is a finish grinding operation to produce a smooth, uniform surface. Each side (top and bottom) of the epoxy-filled ceramic is subjected to the grinding operations. The finish grinding operation can be accomplished by any acceptable methods that produce a smooth uniform surface. Linear grinding, lapping and back grinding all are acceptable finish grinding steps. FIG. 4 depicts the face of the ceramic workpiece 30 after finish grinding, showing the ceramic posts 12 surrounded by the epoxy 24, the ceramic posts 12 being depressed about 15,000-30,000 Angstrom units below the surface of the epoxy 24.

In order to place the ceramic posts 12 in the same plane as the epoxy 24 and to remove portions of the ceramic posts 12 damaged during the grinding operation, the ceramic workpiece 30 is placed in an acid solution. The acid solution is selected to etch the ceramic posts 12 as a pre-plating step. While the acid selected will depend upon the specific ceramic material used, a solution of $HBF_4$ and $HNO_3$ has been effective in etching PZT ceramic. More specifically, a preferred 2000 milliliter solution having about 200 milliliters of $HNO_3$ (50% concentrated acid by volume) and about 4 milliliters of $HBF_4$ (50% concentrated acid by volume) was mixed by adding the concentrated acids to about 1796 milliliters of water to yield a solution of about 0.1% $HBF_4$ by volume and about 5% $HNO_3$ by volume. While this solution is an exemplary solution, it will be understood that other concentrations of the disclosed acids and other acids may be used without departing from the scope of the invention, as long as the acid etches the grain boundaries of the ceramic grains. The ceramic workpiece 30 is vibrated in this acid solution in an ultrasonic cleaner for a time sufficient to etch the ceramic posts. The preferred time for etching is about 30 seconds, although the etching time will depend on the concentration of the acid and the acids used. The time must be sufficient to etch the grain boundaries of the ceramic posts 12 to facilitate removal of ceramic material which may have been damaged during the grinding operations. All ultrasonic cleaners described herein operate at 80 KHz, although the ultrasonic cleaners may be operated at different frequencies, so long as the required process step is successfully accomplished.

After etching, the ceramic workpiece 30 is removed from the cleaner and the acid is neutralized. The preferred method for neutralizing the acid is a multi-step wash with deionized water. The ceramic workpiece 30 is first rinsed with deionized water for about two minutes. Then, the ceramic workpiece 30 is placed into a second ultrasonic cleaner having deionized water for a preselected period of time, about 3-4 minutes, after which it is spray dried, with a non-reactive gas such as nitrogen, although an inert gas may be used. In one embodiment, dry filtered air is used to dry the ceramic workpiece 30.

Next, the epoxy 24 is preferentially removed by plasma etching so that the ceramic posts 12 do not remain depressed below the epoxy 24. Plasma etching of the epoxy 24 is accomplished with a high energy gas stream that removes the epoxy 24 from the surface of the ceramic workpiece 30, but does not adversely affect the ceramic posts 12. Oxygen is the preferred plasma etching gas. During the plasma etching operation, the plasma stream may reach a temperature in the range of about 250° F.-290° F. The plasma etching can be accomplished at a rate of about 1,500 Angstroms per minute and continue for a sufficient length to time, to produce ceramic posts 12 having the required elevation over the epoxy 24. The amount of time required for the plasma etch will vary, depending upon the amount of epoxy 24 on the ceramic workpiece 30 after either finish grinding or polishing, a longer time being required for a greater amount of epoxy 24. Since etching the surface to achieve a plane including both the epoxy 24 and the ceramic posts 12 of a few atomic layers in thickness is extremely difficult to accomplish, epoxy 24 is etched sufficiently so that the ceramic posts 12 are slightly above the adjacent epoxy 24, but no more than about 25,000 Angstroms above the epoxy 24. This preferred configuration with the ceramic posts 12 projecting above the epoxy 24 is shown in FIG. 1. Both sides of the ceramic workpiece 30 are plasma etched in this fashion.

Immediately after the plasma etching process is completed, the ceramic workpiece 30 is placed into a sputtering chamber, and the opposed faces of the etched ceramic layer 10 are sputter plated at a maximum temperature of about 75° C. (167° F.) and more preferably at a maximum temperature of about 62° C. (144° F.). The selected temperature is related to the expansion of the epoxy. If the temperature is too high, the expansion of the epoxy is too great and the sputtered plating is adversely affected. For epoxy 24, the temperature is about 10° C. to about 15° C. above the $t_g$ (glass transition temperature) of the epoxy 24. As is clear, the maximum sputtering temperature will vary from polymer composition to polymer composition, as the expansion/contraction of the polymer is the determining factor affecting the plating. The combination of the lower sputtering temperature of the atoms, the etching of the ceramic posts 12, and the ceramic posts 12 being above or about at the same level as the epoxy 24 provides better adhesion of the plating to the surface of the ceramic layer 10. Because of the differences in thermal expansion between the ceramic posts 12, the epoxy 24 and the metallic materials comprising the plating, avoiding the elevated temperatures of the prior art processing and maintaining the plating process at 75° C. and below reduces thermally induced stresses in the very thin plating as the ceramic workpiece 30 cools, thereby providing a piezoelectric ceramic layer 10 having a higher reliability, since the probability of failure due to plating failure is reduced.

The plating is preferably applied as a trilayer of titanium, palladium and silver. The titanium is applied as a first layer to a thickness of about 300 to about 600 Angstrom units under a vacuum of about 1.5 mTorr. The palladium layer is applied over the titanium to a thickness of about 2000-3000 Angstroms under a vacuum of about 4 mTorr. The silver layer is applied over the palladium layer to a thickness of about 9,000-12,000 Angstroms under a vacuum of about 4 mTorr. In order to maintain the temperature at 60° C. or below, it is necessary to sputter at a current of about 500 milliamps, which is carefully controlled. The initial voltage was 408 volts, but the potential in not carefully controlled and will vary depending upon the target material. However, to avoid exceeding the maximum temperature, it is necessary to sputter the silver in a plurality of stages. At the above-noted amperage and voltage, four separate plating stages of 10 minutes with an intervening period of time for cooling are required. After sputter plating is complete, both the top and bottom faces of the ceramic layer 10 are essentially completely covered with the plating.

Figure 5:
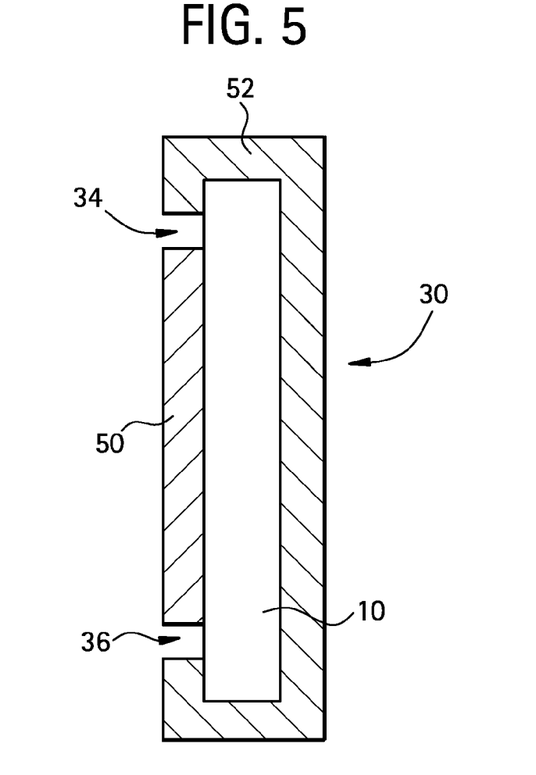
FIG. 5 is a cross-sectional view of the piezoelectric ceramic layer with signal electrode and ground electrode.
Figure 6:
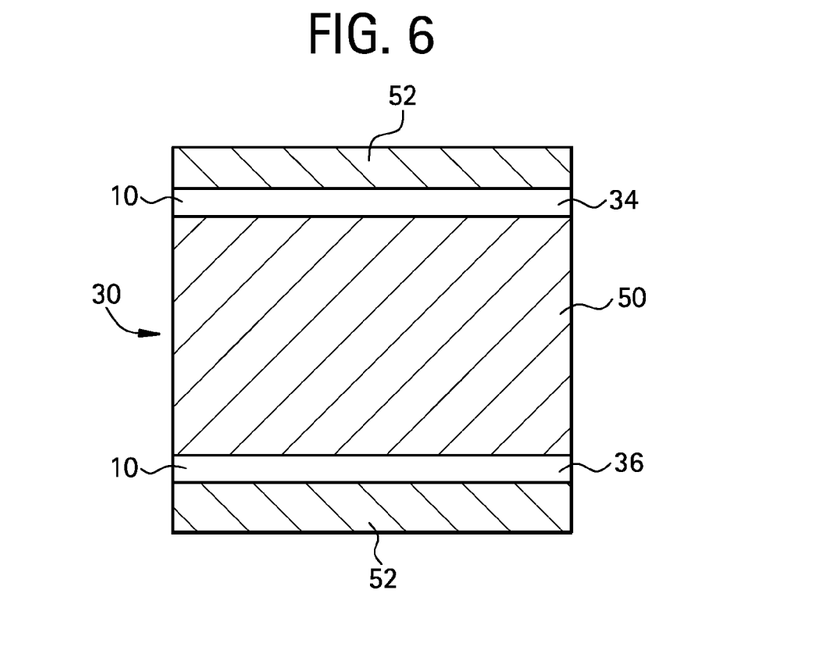
FIG. 6 is top view of the piezoelectric ceramic layer with signal electrode and ground electrode.

After sputter plating is complete, the ceramic workpiece 30 is further processed to form a signal electrode 50 and ground electrode 52 on the top and bottom faces of the piezoelectric ceramic layer 10 shown in FIGS. 5 and 6, depicting a cross-sectional and top view respectively of the sputter plated piezoelectric ceramic layer 10 with a signal electrode 50 and ground electrode 52 formed from the sputter plating metals. It will be understood by those skilled in the art that there are several different configurations to provide one or more signal electrodes 50 and one or more ground electrodes 52 without departing from the scope of the invention. Given that ultrasonic pulses are often negative pulses, the signal electrode 50 is sometimes referred to as the negative electrode and the ground electrode 52 is sometimes referred to as the positive electrode.

In one embodiment of the invention, the ground electrode 52 extends across the back face of the piezoelectric ceramic layer 10 and wraps around the edges of the top face, while the signal electrode 50 extends across a portion of the top face. In order to isolate the ground electrode 52 from the signal electrode 50 as shown in FIGS. 5 and 6, the left edge and right edge of the ceramic workpiece 30 are cut to remove the electrical connection between the top face and bottom face at that portion of the ceramic workpiece 30. Next, to complete the isolation, a dicing saw is used near the top edge and bottom edge of the ceramic workpiece 30, creating kerfs 34, 36 by cutting through and removing the plating in those areas thereby exposing the piezoelectric ceramic layer 10 and isolating the signal electrode 50 on the top face from the ground electrode 52 on the edge of the top face of the piezoelectric ceramic layer 10.

After the electrodes are formed, the ceramic workpiece 30 is poled to activate the piezoelectric ceramic posts 12 at a temperature of up to about 60° C. (140° F.). Preferably the plating temperature is maintained at a temperature below about 60° C. Poling entails inducing a high voltage field across the ceramic posts 12. The ceramic workpiece 30 is immersed in a dielectric fluid to prevent arcing. Poling is accomplished at a temperature below about 60° C., which is a lower temperature than the prior art poling temperature of 110° C. recommended by the manufacturer of PZT. Poling is accomplished at a higher voltage/unit thickness, up to about 150 volts (V) per 0.001". The poling provides an electrical potential to each of the individual ceramic posts 12. The advantage of the lower poling temperature is that the epoxy 24 expansion is reduced so as not to adversely affect the plating. The poling temperature that may be used will vary from polymer to polymer being dependent on the thermal expansion of the polymer and the temperature required to accomplish poling.

Figure 7:
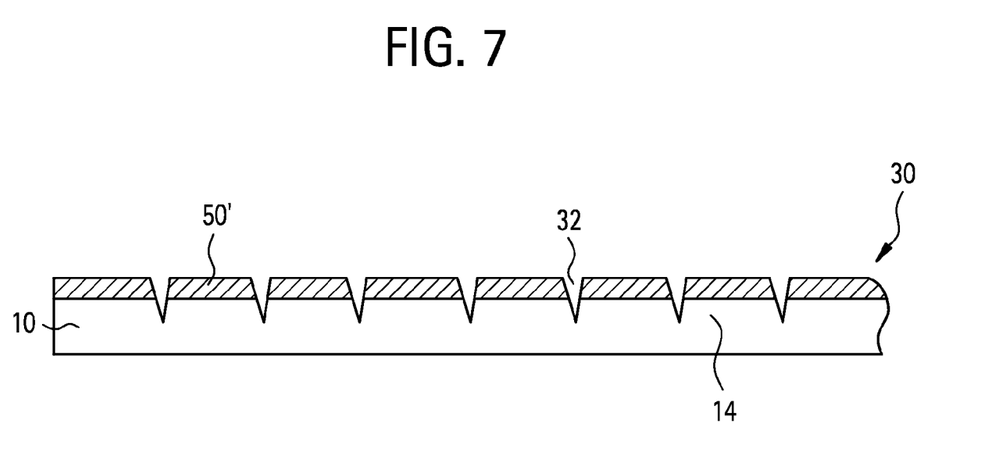
FIG. 7 is a cross-sectional view of the shallow diced ceramic workpiece.
Figure 8:
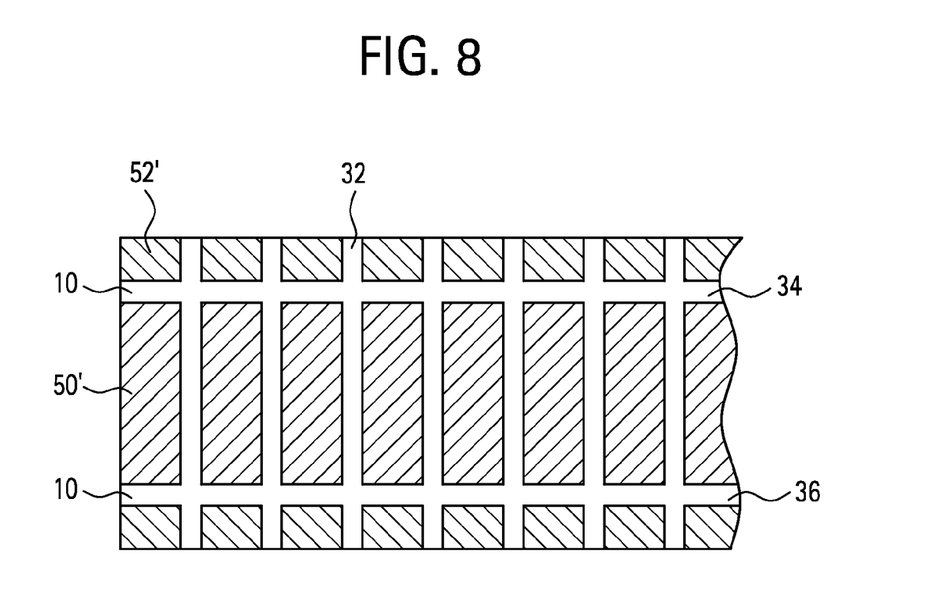
FIG. 8 is a top view of the shallow diced ceramic workpiece.

After the poling process, the top face of the ceramic workpiece 30 is shallow diced, creating isolation cuts 32 at predetermined pitch and kerf dimensions as shown in FIGS. 7 and 8, depicting a cross-sectional and top view respectively of the diced ceramic workpiece 30. This dicing operation removes the plating from the kerfed portions of the top face, thereby exposing the piezoelectric ceramic layer 10. This dicing operation and resulting isolation cuts 32 create separate groups 14 of ceramic posts 12, each group 14 having separate electrode connections (50', 52') and each physically separated from the adjacent group 14 of ceramic posts 12 by an isolation cut 32. In doing so, the piezoelectric ceramic layer 10 can provide electrical and acoustic isolation between transducer elements without the need to dice through an acoustic stack 100 later in the manufacturing process.

Figure 9:
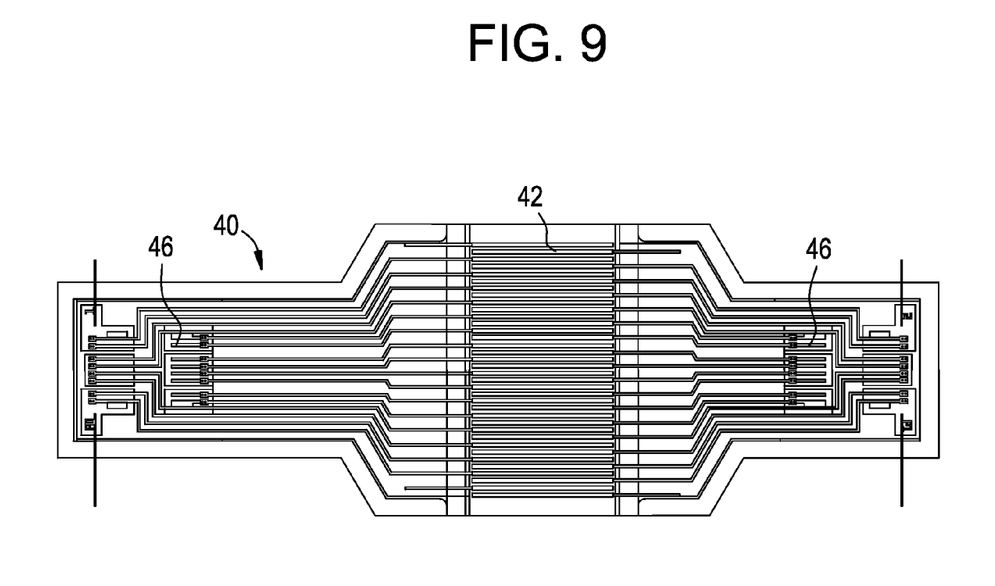
FIG. 9 is a patterned flex circuit having conductive traces extending across the face of the circuit.
Figure 10:
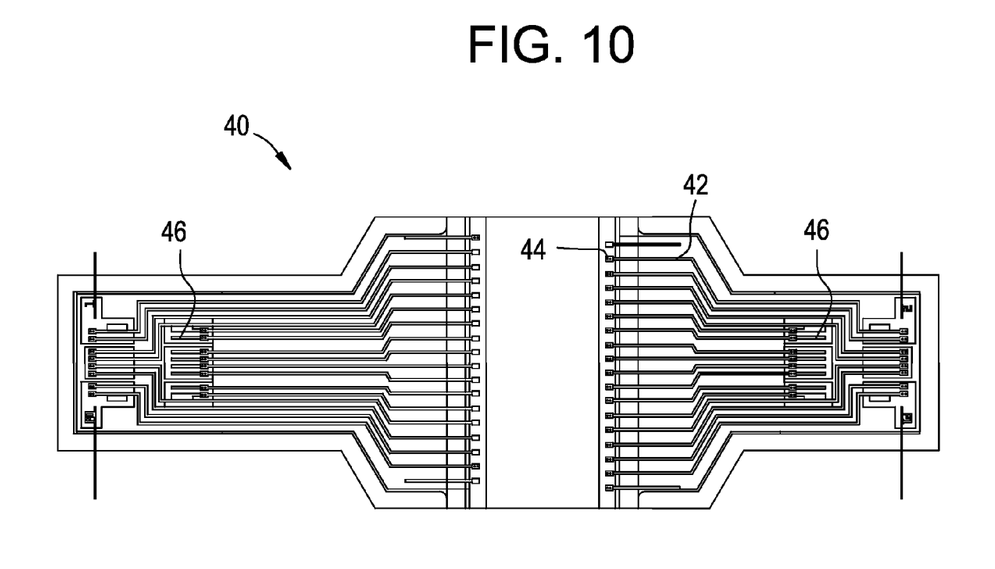
FIG. 10 is a patterned flex circuit having conductive traces that extend to conductive pads.

In order to provide electrical connections to the signal electrode connections 50' and ground electrode connections 52' of the piezoelectric ceramic layer 10, a patterned flex circuit 40 is used with conductive traces 42 aligned with the electrodes 50', 52'. FIGS. 9 and 10 show embodiments of a patterned flex circuit 40 that can be used in the present invention. In FIG. 9, the conductive traces 42 of the patterned flex circuit 40 extend across the face that will be bonded to the electrodes across the face of the piezoelectric ceramic layer 10. In FIG. 10, the conductive traces of the patterned flex circuit extend only to pads 44 that will be bonded to the electrodes at the edges of the piezoelectric ceramic layer 10. It will be understood by those skilled in the art that there are several different patterned flex circuits 40 that can be used to provide electrical connections with the electrodes of the piezoelectric ceramic layer 10 without departing from the scope of the invention, including the use of pads and/or conductive traces. As shown in FIGS. 9 and 10, the patterned flex circuit 40 has conductive traces 42 spaced apart so as to align with the spacing of the electrodes 50', 52' of the piezoelectric ceramic layer 10. In order to facilitate connection to a coaxial cable during construction of an ultrasonic probe, the patterned flex circuit 40 can be provided with pre-fabricated connectors 46 for easy installation.

Figure 12:
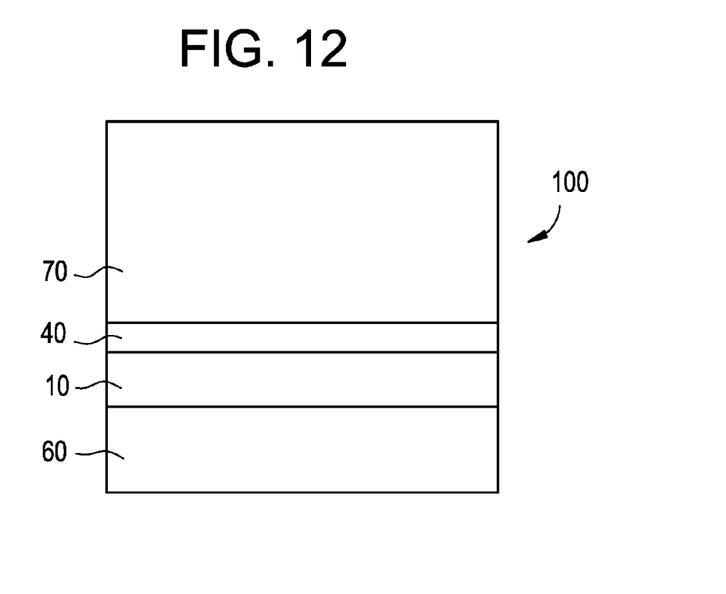
FIG. 12 is a cross-sectional view of an acoustic stack.

FIG. 12 depicts a cross-sectional view of an acoustic stack 100. The acoustic stack 100 can be a layered structure comprising a backing block 70, patterned flex circuit 40, piezoelectric ceramic layer 10, and acoustic matching layer 60. As used herein, the word "stack" is not limited to elements stacked vertically, but rather a "stack" can be oriented at any angle, including horizontal or vertical. It will be understood by those skilled in the art that the acoustic stack 100 can have additional elements or elements configured in a different manner without departing from the scope of the invention.

The various components of the acoustic stack 100 can be bonded together using an adhesive material (e.g., epoxy) and high pressure in a lamination process. In one preferred method, the piezoelectric ceramic layer 10 is completely covered with an epoxy coating, while the face of the backing block 70 and the portion of the patterned flex circuit 40 to be laminated are also coated with epoxy. After epoxy coating, the elements are placed in a vacuum chamber where they are degassed for 2-3 minutes at a vacuum level less than 1 torr or 25 in. Hg. Next, the acoustic matching layer 60 is placed on the base plate of a lamination press and properly secured with mold blocks. Once positioned, a thin layer of epoxy is applied onto the acoustic matching layer 60.

After removing excess epoxy from the piezoelectric ceramic layer 10, it is placed on top of the acoustic matching layer 60 with the isolation cuts 32 of the top face facing up and its bottom face resting on the acoustic matching layer 60. Next, the patterned flex circuit 40 is placed onto the top face of the piezoelectric ceramic layer 10. Individual conductive traces 42 or pads 44 of the patterned flex circuit 40 can be electrically connected to the signal electrodes 50' and/or ground electrodes 52' of the piezoelectric ceramic layer 10 by aligning the conductive traces 42 or pads 44 with the respective electrodes 50', 52'. By using a transparent patterned flex circuit 40, the alignment can be accomplished by visually aligning the non-conductive and transparent dielectric windows of the flex circuit 40 with the isolation cuts 32 made in the piezoelectric ceramic layer 10. The conductive traces 42 can terminate in a patterned flex circuit connector 46, which can mate with a connector used for cables or other wiring from an ultrasonic test unit or other signal processing electronics. Once aligned, the flex circuit 40 is secured in place.

Figure 11:
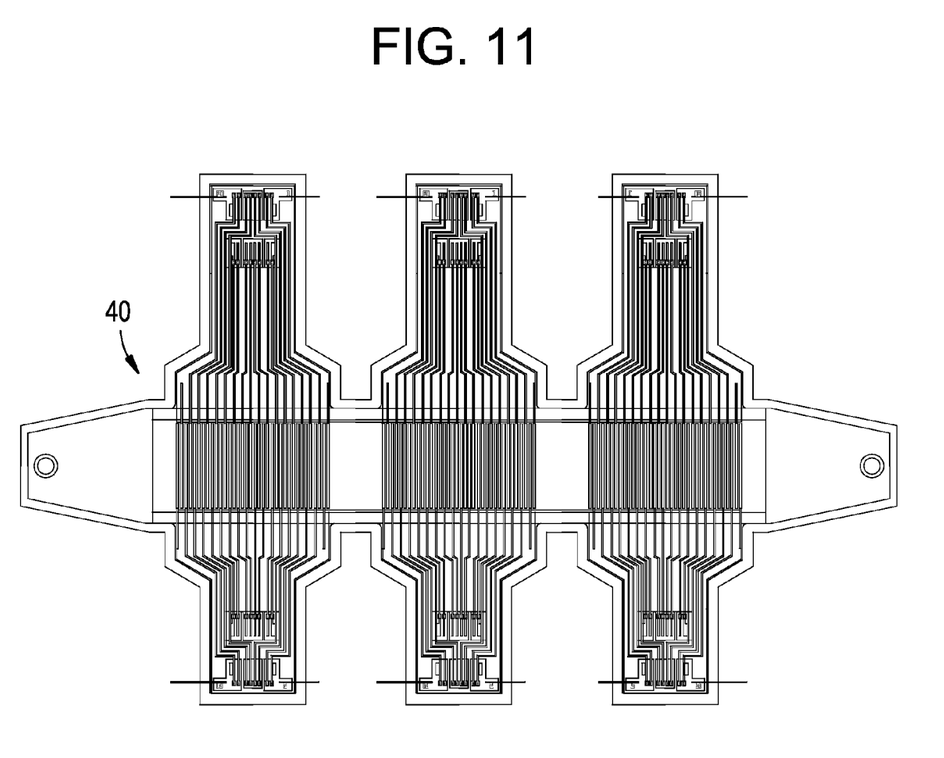
FIG. 11 is a patterned flex circuit that can accommodate three separate acoustic stacks.

The backing block 70 is attached to the ram tool of the lamination press. Once aligned with the patterned flex circuit 40 and other components of the acoustic stack 100, the lamination press ram tool is lowered until the backing block 70 makes contact with the patterned flex circuit 40. The acoustic stack 100 is then subjected to pressure and temperatures over a sufficient period of time to press the elements together and then cure the epoxy material. An acoustic stack 100 manufactured with sufficient length can be cut into separate acoustic stacks, as long as each stack has its own patterned flex circuit 40 as shown in FIG. 11, which illustrates a patterned flexible circuit 40 that can accommodate three separate acoustic stacks 100 from a single manufacturing process. It is understood by those skilled in the art that there are several methods for laminating the elements of the acoustic stack using an adhesive material and press without departing from the scope of the invention.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A method for preparing a piezoelectric ceramic workpiece for use in an ultrasonic transducer, comprising the steps of:
   providing a piezoelectric ceramic layer, wherein said piezoelectric ceramic layer comprises a plurality of ceramic posts isolated from each other by non-conductive material and wherein said plurality of ceramic posts extend above said non-conductive material;
   plating said piezoelectric ceramic layer with conductive material;

forming a first electrode and a second electrode on said piezoelectric ceramic layer from said conductive material on said plurality of ceramic posts;

poling said first electrode and said second electrode on said piezoelectric ceramic layer, wherein said poling activates said plurality of ceramic posts; and dicing said piezoelectric ceramic layer, wherein said dicing forms a plurality of isolation cuts removing said conductive material and thereby forming a plurality of signal electrodes from said first electrode and a plurality of ground electrodes from said second electrode, wherein said isolation cuts extend through only a portion of the thickness of said piezoelectric ceramic layer.

2. A method for preparing a piezoelectric ceramic workpiece for use in an ultrasonic transducer, comprising the steps of:

providing a piezoelectric ceramic layer, wherein said piezoelectric ceramic layer comprises a plurality of ceramic posts isolated from each other by non-conductive material and wherein said plurality of ceramic posts extend above said non-conductive material;

plating the entire surface of said piezoelectric ceramic layer with conductive material;

forming a first electrode and a second electrode on said piezoelectric ceramic layer from said conductive material on said plurality of ceramic posts, wherein said step of forming a first electrode and a second electrode comprises the steps of removing the left edge and the right edge of said piezoelectric ceramic layer;

dicing a top isolation cut proximate the top edge of said piezoelectric ceramic layer;

dicing a bottom isolation cut proximate the bottom edge of said piezoelectric ceramic layer; and wherein said first electrode extends across the top face of said piezoelectric ceramic layer and said second electrode extends across the back face and wraps around said top and bottom edges of said top face of said piezoelectric ceramic layer;

poling said first electrode and said second electrode on said piezoelectric ceramic layer, wherein said poling activates said plurality of ceramic posts; and dicing said piezoelectric ceramic layer, wherein said dicing forms a plurality of isolation cuts removing said conductive material and thereby forming a plurality of signal electrodes from said first electrode and a plurality of ground electrodes from said second electrode.

3. A method for manufacturing an acoustic stack for use in an ultrasonic transducer, comprising the steps of:

providing a piezoelectric ceramic layer, wherein said piezoelectric ceramic layer comprises a plurality of ceramic posts isolated from each other by non-conductive material and wherein said plurality of ceramic posts extend above said non-conductive material;

plating said piezoelectric ceramic layer with conductive material;

forming a first electrode and a second electrode on said piezoelectric ceramic layer from said conductive material on said plurality of ceramic posts;

poling said first electrode and said second electrode on said piezoelectric ceramic layer, wherein said poling activates said plurality of ceramic posts;

dicing said piezoelectric ceramic layer, wherein said dicing forms a plurality of isolation cuts removing said conductive material and thereby forming a plurality of signal electrodes from said first electrode and a plurality of ground electrodes from said second electrode;

providing a flexible printed circuit board, wherein said flexible circuit board comprises a first plurality of conductive elements configured to physically align with said plurality of signal electrodes and a second plurality of conductive elements configured to physically align with said plurality of ground electrodes;

providing adhesive non-conductive material between said piezoelectric ceramic layer and said flexible printed circuit board, wherein said adhesive non-conductive material covers said plurality of ceramic posts; and bonding said piezoelectric ceramic layer to said flexible printed circuit board thereby forming electrical connections between said first plurality of conductive elements and said plurality of signal electrodes on said plurality of ceramic posts and electrical connections between said second plurality of conductive elements and said plurality of ground electrodes on said plurality of ceramic posts, wherein said plurality of ceramic posts remove said adhesive non-conductive material during said bonding to form said electrical connections.

4. The method of claim 3, wherein said isolation cuts extend through only a portion of the thickness of said piezoelectric ceramic layer.

5. The method of claim 3, wherein said step of plating said piezoelectric ceramic layer with conductive material comprises the step of plating the entire surface of said piezoelectric ceramic layer.

6. The method of claim 3, wherein said step of bonding said piezoelectric ceramic layer to said flexible printed circuit board further comprises the step of aligning transparent non-conductive portions of said flexible printed circuit board with said isolation cuts of said piezoelectric ceramic layer.

7. The method of claim 3, wherein said step of bonding said piezoelectric ceramic layer to said flexible printed circuit board is a lamination process.

8. The method of claim 3, further comprising the steps of:

providing adhesive non-conductive material between said piezoelectric ceramic layer and an acoustic layer, wherein said adhesive non-conductive material covers said plurality of ceramic posts; and bonding said piezoelectric ceramic layer to said acoustic layer.

9. The method of claim 3, wherein said non-conductive material is an epoxy.

10. The method of claim 5, wherein said step of forming a first electrode and a second electrode on said plurality of ceramic posts of said piezoelectric ceramic layer, comprises the steps of:

removing the left edge and the right edge of said piezoelectric ceramic layer;

dicing a top isolation cut proximate the top edge of said piezoelectric ceramic layer;

dicing a bottom isolation cut proximate the bottom edge of said piezoelectric ceramic layer; and wherein said first electrode extends across the top face of said piezoelectric ceramic layer and said second electrode extends across the back face and wraps around said top and bottom edges of said top face of said piezoelectric ceramic layer.

* * * * *